United States Patent
LeDuc et al.

(10) Patent No.: US 12,339,585 B2
(45) Date of Patent: Jun. 24, 2025

(54) POLYCARBONATE HEAT MOLDING FOR SOFT LITHOGRAPHY

(71) Applicant: CARNEGIE MELLON UNIVERSITY, Pittsburgh, PA (US)

(72) Inventors: Philip R. LeDuc, Pittsburgh, PA (US); Utku Sonmez, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 384 days.

(21) Appl. No.: 17/681,676

(22) Filed: Feb. 25, 2022

(65) Prior Publication Data

US 2022/0269168 A1 Aug. 25, 2022

Related U.S. Application Data

(60) Provisional application No. 63/153,423, filed on Feb. 25, 2021.

(51) Int. Cl.
*G03F 7/00* (2006.01)

(52) U.S. Cl.
CPC .................. *G03F 7/0017* (2013.01)

(58) Field of Classification Search
CPC ........................... G03F 7/0002; G03F 7/0017
See application file for complete search history.

(56) References Cited

U.S. PATENT DOCUMENTS

2004/0266975 A1* 12/2004 Rohner ...................... C08J 5/00
528/196

OTHER PUBLICATIONS

Becker, H. et al. "Hot embossing as a method for the fabrication of polymer high aspect ratio structures." Sensors and Actuators A: Physical 83, No. 1-3 (2000): 130-135.

(Continued)

*Primary Examiner* — James Sanders
(74) *Attorney, Agent, or Firm* — Michael G. Monyok

(57) ABSTRACT

A method of replicating master molds used in the fabrication of microsystems having micron to millimeter sized features. Master molds are replicated using a polymer sheet, which is heated and melted onto an elastomeric mold fabricated from the master mold. The copy molds accurately replicate the geometries of the master mold, such as high aspect ratio features, microposts, and channels with slender sidewalls. The polymer sheet encases the elastomeric mold without the application of an external force, permitting copying without deformation of the features.

16 Claims, 9 Drawing Sheets

(56) References Cited

OTHER PUBLICATIONS

Desai, S. et al. "Plastic masters—rigid templates for soft lithography." Lab on a Chip 9, No. 11 (2009): 1631-1637.
Jiang, X. et al. "Controlling mammalian cell spreading and cytoskeletal arrangement with conveniently fabricated continuous wavy features on poly (dimethylsiloxane)." Langmuir 18, No. 8 (2002): 3273-3280.
Nargang, T. et al. "Liquid polystyrene: a room-temperature photocurable soft lithography compatible pour- and-cure-type polystyrene." Lab on a Chip 14, No. 15 (2014): 2698-2708.
Roy, E. et al. "Thermoplastic elastomers for microfluidics: Towards a high-throughput fabrication method of multilayered microfluidic devices." Lab on a Chip 11, No. 18 (2011): 3193-3196.
Shorr, A. et al. "High-throughput mechanotransduction in *Drosophila* embroys with mesofluidics." Lab on a Chip 19, No. 7 (2019): 1141-1152.
Wang, Y. et al. "Benchtop micromolding of polystyrene by soft lithography." Lab on a Chip 11, No. 19 (2011): 3089-3097.
Wilson, M.E. et al. "Fabrication of circular microfluidic channels by combining mechanical micromilling and soft lithography." Lab on a Chip 11, No. 8 (2011): 1550-1555.

\* cited by examiner

POLYCARBONATE HEAT MOLDING FOR SOFT LITHOGRAPHY

CROSS-REFERENCE TO RELATED APPLICATIONS

This application claims the benefit under 35 U.S.C. § 119 of U.S. Provisional Application Ser. No. 63/153,423, filed Feb. 25, 2021, which is incorporated herein by reference.

STATEMENT REGARDING FEDERALLY SPONSORED RESEARCH

This invention was made with government support under FA9550-18-1-0262 awarded by the Air Force Office of Scientific Research. The government has certain rights in the invention.

BACKGROUND OF THE INVENTION

The present disclosure is related generally to replica molding. More specifically, the disclosure is related to the duplication of master molds with sheets of polycarbonate or similar polymers suitable for use in the production of microsystems.

A molding process utilizing soft lithography or other methods to create master molds is a prominent technique for rapidly fabricating miniaturized devices for a variety of fields including chemistry, material science, and biology. For example, these miniaturized devices, or microsystems, are often used as lab-on-a-chip systems to study biophysical aspects of various phenomena such as cell alignment, migration, signaling, gene expression, and differentiation. Fabrication of devices using this technique conventionally requires casting of pre-cured elastomers on rigid silicon/photoresist (Si—Pr) composite master molds. The pre-cured elastomer, such as polydimethylsiloxane (PDMS), replicates the features of the master mold and is used as the working microsystem once cured.

Although this fabrication approach has been used successfully in the past, challenges associated with master mold fabrication inhibits continued innovation in the microtechnological fields. Production of composite master molds often occurs in a cleanroom environment, requiring expertise and high material and equipment costs. These drawbacks also limit the potential for commercialization. In addition, the composite master molds have a limited casting lifetime, meaning they can produce only a limited number of working microsystems before failing. The limited casting lifetime is a result of the differing properties of the separate materials in the composite master mold, which can lead to delamination, particularly with high aspect ratio microfeatures.

Mechanical micromilling and 3D printing have also been utilized for the fabrication of master molds. However, mechanical micromilling also requires sophisticated tools and expensive equipment, cannot be scaled up for mass production easily, and fabrication parameters must be optimized for each substrate type and geometry. Also, the aspect ratio of the features produced by micromilling are limited due to micro end mill failure along with the inability of the milling process to produce sharp inner corners. 3D printing suffers from limited feature resolution, which is far less than photolithography, has surface roughness challenges, and can inhibit the curing of PDMS on 3D printed molds due to residual compounds remaining in the mold structure during fabrication. In addition, vertical sidewalls with sharp edges cannot be produced by 3D printing due to a scalloping effect.

Due to the problems associated with master mold production, several techniques have been proposed to copy the existing master molds to reproduce damaged master molds or to scale fabrication, instead of using time consuming, expensive, and cumbersome master mold fabrication methods. These copying techniques use PDMS elastomers that have been fabricated using the master mold as an intermediate, elastomeric mold to fabricate rigid copy molds through an additional replica molding process. These techniques often require the pouring of a pre-cured mold material on the elastomeric PDMS mold, degassing, and curing. Pouring the mold material and removing the trapped bubbles can distort the features on the elastomeric, non-rigid PDMS mold by applying instantaneous drag force on them, especially if the PDMS mold has high aspect ratio protrusions such as thin sidewalls and microposts. More conventional techniques such as hot embossing or injection molding also distort features resulting from the forces applied to the elastomeric mold. None of these approaches have shown successful fabrication of copy master molds for high aspect ratio features at different scales. Since PDMS itself is an elastomeric material, such slender geometries are inherently prone to distortions during the master mold copying process.

Therefore, it would be advantageous to develop a simplified, low-cost process of replicating master molds used for the fabrication of complex microsystems, where the copy master molds accurately replicate with high resolution a variety of geometries, including high aspect ratio features, vertical sidewalls with sharp edges, and varying size scales.

BRIEF SUMMARY

According to embodiments of the present disclosure is method of replicating master molds used for the production of microsystems. The replication process creates copies of master molds from monolithic polymer sheets. The method can be used with master molds fabricated through photolithography, mechanical micromilling, 3D printing, as well as other techniques known in the art. Microsystems with sub-micron feature sizes and high aspect ratios can be successfully copied from the polymer copy molds. This method can also be used to combine different master molds with several unique geometries into a single monolithic copy mold, enabling rapid production scaling. The master mold replication method can be performed outside the cleanroom without using any sophisticated equipment.

In one embodiment of the method, solid polycarbonate thermoplastic sheets are used as a starting material and are melted on polydimethylsiloxane (PDMS) parts or intermediate molds by heating above the glass transition temperature ($T_g$) of the polycarbonate. The PDMS parts are created from the master mold and may contain a variety of microfeatures and geometries. The process is done without applying any external force to the polycarbonate sheet or PDMS part, allowing the sheet to conform to the shape of the PDMS part while avoiding distortion of the microfeatures. The PDMS parts are created from master molds, such as silicon/photoresist composite molds fabricated through traditional techniques. As the polycarbonate sheet melts, it slowly fills the gap between the sheet and the surfaces of the PDMS part. During the melting stage of the process, the microfeatures of the part are transferred to the polycarbonate sheet. Cooling returns the polycarbonate sheet to a rigid state.

The polycarbonate sheet, thus, becomes a copy of the master mold. The polycarbonate copy molds have robust structural integrity, especially compared to composite master molds. The polycarbonate copy molds have a significantly longer casting lifetime and can be used to mold numerous microsystems. This molding approach can be employed to overcome fabrication problems and limited lifetime challenges associated with the master molds as well as to increase the throughput and feasibility of complex microsystem fabrication.

DETAILED DESCRIPTION

Figure 1:
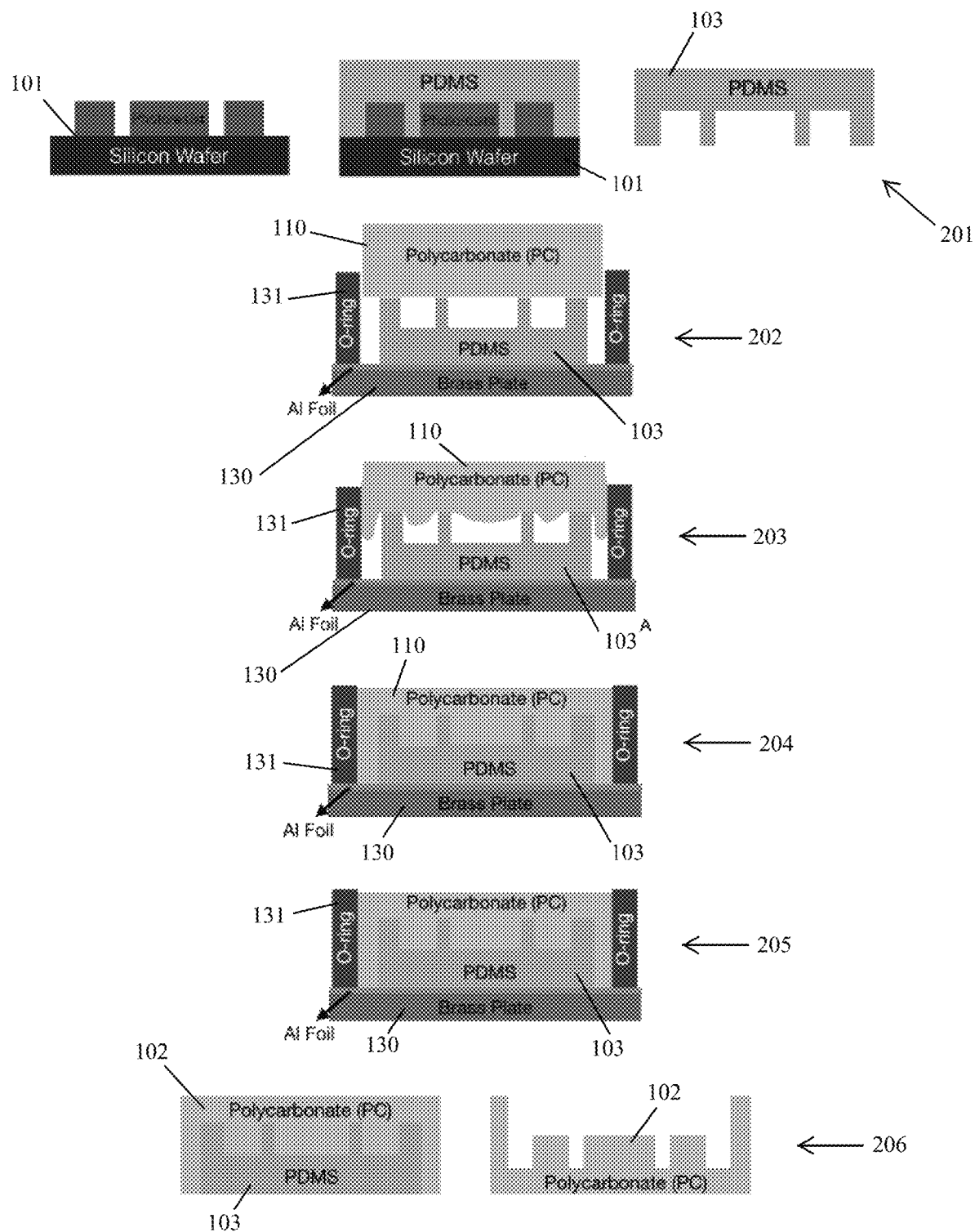
FIG. 1 is a graphical flowchart showing the steps of the molding method, according to one embodiment.

According to embodiments of the disclosure is method for replicating a master mold 101 of a complex microsystem 120, forming a copy mold 102. As shown in FIG. 1, the method comprises the following steps: step 201—create an elastomeric mold (or elastomeric part) 103 using the master mold 101; step 202—place a sheet 110 of a solid thermoplastic polymer on top of the elastomeric mold 103; step 203—heat the polymer sheet 110 above its glass transition temperature ($T_g$); step 204—maintain the temperature until the polymer sheet 110 encases the elastomeric mold 103; step 205—cool the sheet 110 below the glass transition temperature, forming a polymer copy mold 102; and step 206—remove the elastomer elastomeric mold 103 from the copy mold 102. The copy mold 102, which is a copy of the master mold 101, can now be used to fabricate working copies of the microsystem 120 or to create additional elastomeric molds 103, enabling the process to be replicated again. As shown in FIG. 1, the elastomeric mold 103 is a negative of the master and copy molds 101, 103.

Referring again to FIG. 1, step 201 involves forming an elastomeric mold 103 from a master mold 101. The elastomeric mold 103, or replica mold, can be used to create copy molds 102 or it can be used as part of a functioning microsystem 120. The master mold 101 can be fabricated from a variety of techniques known in the art, such as photolithography, mechanical micromilling, and 3D printing, among others. In one example embodiment, the master mold 101 is fabricated by photolithography. In this example, silicon wafers are spin coated using negative photoresist materials (SU8 type). The particular photoresist used may vary depending on the height of the features required on the master mold 101. Photoresist-coated wafers are exposed to 365 nm UV-light through a chrome photolithography mask and uncrosslinked photoresist is removed with SU-8 developer. Other photolithography techniques known in the art can also be used in fabricating the master mold 101.

In another example embodiment, mechanical micromilling is used to fabricate microfeatures on a blank poly(methyl methacrylate) (PMMA) workpiece using tungsten carbide micro end mills. The microtopology geometries can be created in a drafting program, such as SolidWorks 2016 and tool paths are generated using additional software. After machining, the PMMA workpiece can be used as a master mold 101. Alternatively, 3D printing can be used to fabricate multi-step low resolution master mold 101 geometries through stereolithography. Using a photocurable resin, 3D computer-aided design (CAD) geometries are sliced into 25 μm thick layers, and each layer is photo-crosslinked in a high-quality mode setting. Fabricated molds 101 can be post-cured with UV to increase their mechanical strength.

To form the elastomeric mold 103, an elastomer is cast onto the master mold 101. In one example, polydimethylsiloxane (PDMS), such as Sylgard 184, is mixed with a curing agent at a 5:1 mass ratio and degassed with a centrifuge (2000 rpm, 5 minutes). Degassed PDMS is then poured onto the master mold 101 and degassed again in a desiccator. The PDMS-covered master mold 101 is then baked in a convection oven at 60° C. for 90 minutes, ensuring that the curing temperature does not exceed the heat deflection temperature of the master mold material. Now crosslinked after curing, the PDMS is allowed to cool to room temperature before being separated from the master mold 101. The PDMS removed from the master mold 101 can be used as a microsystem 120, or it can be used as a replica mold 103 to produce the copy mold 102.

Figure 2:
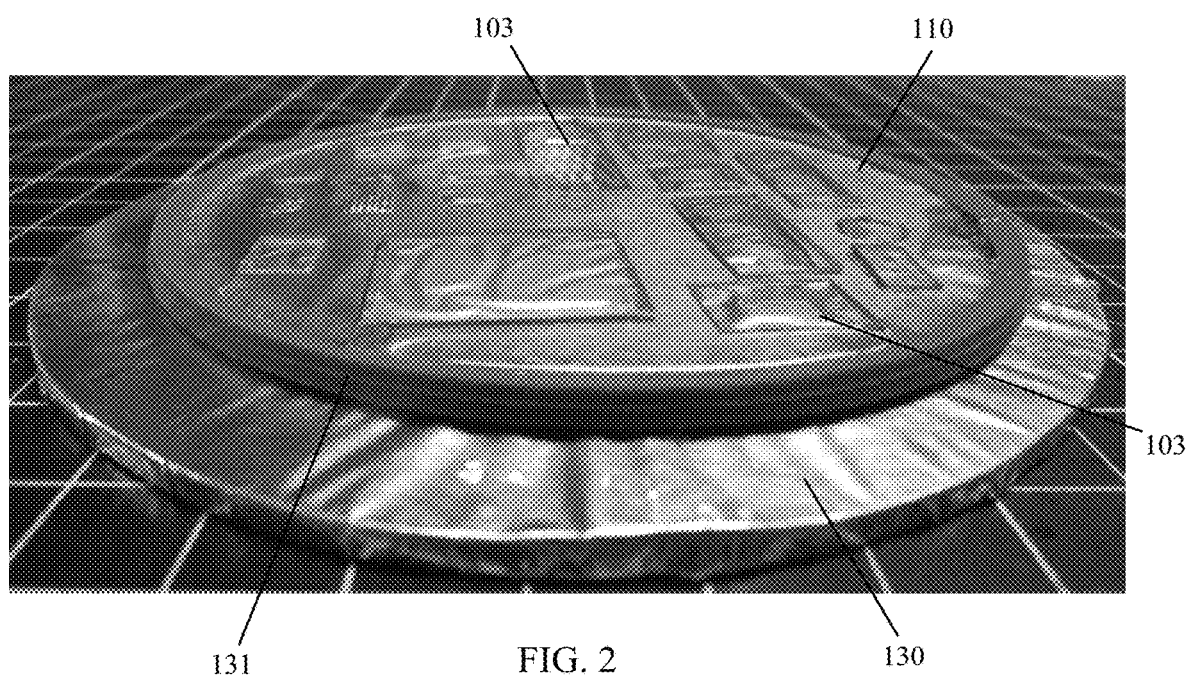
FIG. 2 shows a copy mold being formed during an intermediate step of the method.

Prior to placing the polymer sheet 110 on the replica mold 103 at step 202, the PDMS parts are placed on a brass substrate 130 that is covered with an aluminum sheet and coated with Tridecafluoro-1,1,2,2-tetrahydrooctyl-1-trichlorosilane (TFOCS) to ease removal of the replica mold 103 from the copy mold 102 at the end of the process. Further, a rectangular cross-section O-ring 131 can be used to contain the melted polymer sheet 110, preventing it from spreading and thinning during the melting step. The substrate 130 and O-rings 131 are shown in FIG. 2, where a polymer sheet 110 is covering multiple replica molds 103. In addition to an O-ring 131 and brass substrate 130, other physical barriers can be used to constrain the shape and thickness of the polymer sheet 110 during the melting phase.

In one embodiment, polycarbonate (PC) is used as the material for the polymer sheet 110. However, other types of thermoplastic polymers can be used. Similar to many polymers, PC is hygroscopic and it absorbs moisture from the atmosphere. This absorbed moisture is likely to cause the formation of bubbles throughout the PC sheet 110 when it is heated above the boiling temperature of water. Therefore, the PC sheet 110 is dried at a temperature below the $T_g$ prior to using it in step 203. Since PC absorbs moisture very quickly, step 203 can be performed immediately after drying. Once heated above the $T_g$ at step 203, the softened PC sheet 110 beings to fill the microfeatures on the PDMS replica mold 103.

Figure 3:
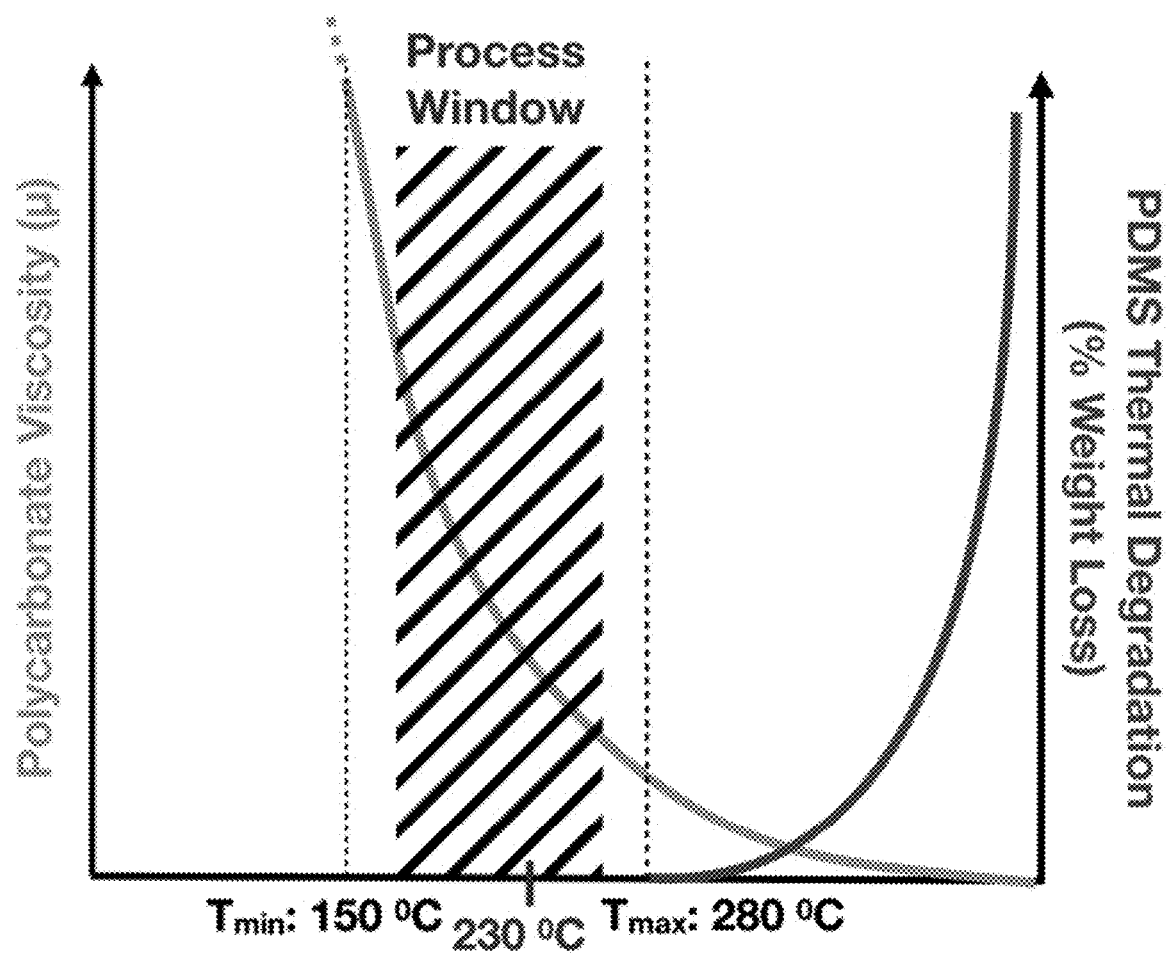
FIG. 3 is a graph depicting a temperature process window.

In one embodiment, the thickness of the PC sheet 110 is greater than the thickness of the PDMS replica mold 103 to ensure that the PC sheet 110 covers the entire PDMS mold 103 once it melts. PC has properties that are useful in this application. For example, the $T_g$ of PC is 147° C. and the viscosity of PC decreases rapidly as the temperature exceeds $T_g$. At $T_g$ the PC sheet becomes soft, pliable, and remains as a single cohesive sheet 110. That is, the PC sheet 110 does not become fully liquid during the melting step. Setting the process temperature at a temperature above the $T_g$ will allow the PC sheet 110 to easily fill the PDMS replica mold 103 with a less viscous PC melt. However, there is a limit to the operating temperature. The thermal degradation temperature of PDMS, which is ~280° C., creates an upper limit for the process temperature. For this reason, the process temperature for this example embodiment is set to 230° C. since further increases in temperature will not substantially decrease the viscosity of the PC and the risk for PDMS thermal degradation is very low relative to its reported thermal degradation temperature. An example of this operating window for the process temperature is shown in FIG. 3. FIG. 3 depicts the viscosity of PC (left-most line) as a function of temperature versus the thermal degradation of PDMS by percent weight loss (right-most line). At range greater than the $T_g$ and less than thermal degradation temperature is the process window.

Under the conditions described in this example embodiment, the temperature is maintained for 4 hours at step 204 and is sufficient to copy any geometry of the master mold 101 (which was copied onto the elastomeric replica mold 103) onto the PC sheet 110, forming a master copy mold 102. The time may be dependent on the surface geometries of the mold 102 and lower baking durations are sufficient for simple low aspect ratio geometries. After maintaining the temperature for a period of time sufficient to allow encapsulation of the replica mold 103, the process temperature is lowered to room temperature for 1 hour at step 205, allowing the PC of the copy mold 102 to re-solidify. Cooling can occur naturally or through the use of a fan or other cooling devices. After cooling, the O-ring 131 and brass plate 130 are removed followed by peeling off the aluminum sheet and PDMS replica mold 103 at step 206.

Figure 4:
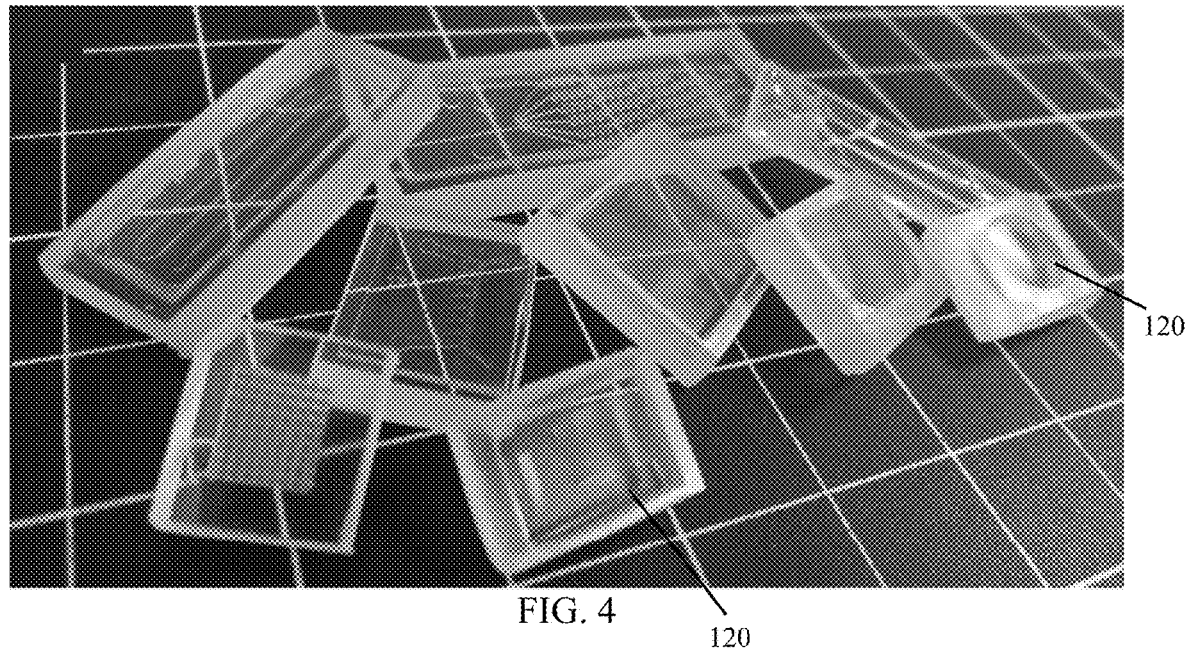
FIG. 4 shows various microsystems fabricated from copy molds.

The remaining PC copy mold 102 has the same surface topology as the original master mold 101 as well as the same thickness as the PDMS replica mold 103 used in the process. Thus, it can now be used as a copy mold 102 to produce more PDMS microsystems 120 through replica molding. FIG. 4 shows several microsystems 120 fabricated using a copy mold 102 formed by the method described herein. When making production microsystems 120 using the copy mold 102, the PC copy mold 102 can be coated with TFOCS to ease separation, especially for high aspect ratio geometries. However, a PC copy mold 102 with common geometries may not require TFOCS as PC does not adhere to cured PDMS due to the significantly lower surface energy of PC compared to the monocrystalline silicon of the master mold 101. During production of a microsystem 120, pre-cured PDMS can be baked in the PC copy mold 102 up to the heat deflection temperature of PC, which is 130° C., without warping.

The PDMS part or microsystem 120 produced from the copy mold 102 can also be used repeatably to fabricate additional copy molds 102, increasing the throughput of mold fabrication. Additionally, when PDMS replica molding is accomplished through a PC copy mold 102, the height of the PDMS part 120 is preserved. This is very important for many applications where the PDMS thickness is critical for preserving the microchannel geometry. When PDMS parts 120 are fabricated from a composite master mold 101, their thickness is determined relatively arbitrarily depending on the exact amount of PDMS poured on the composite master molds 101 from one fabrication run to the next.

Figure 5:
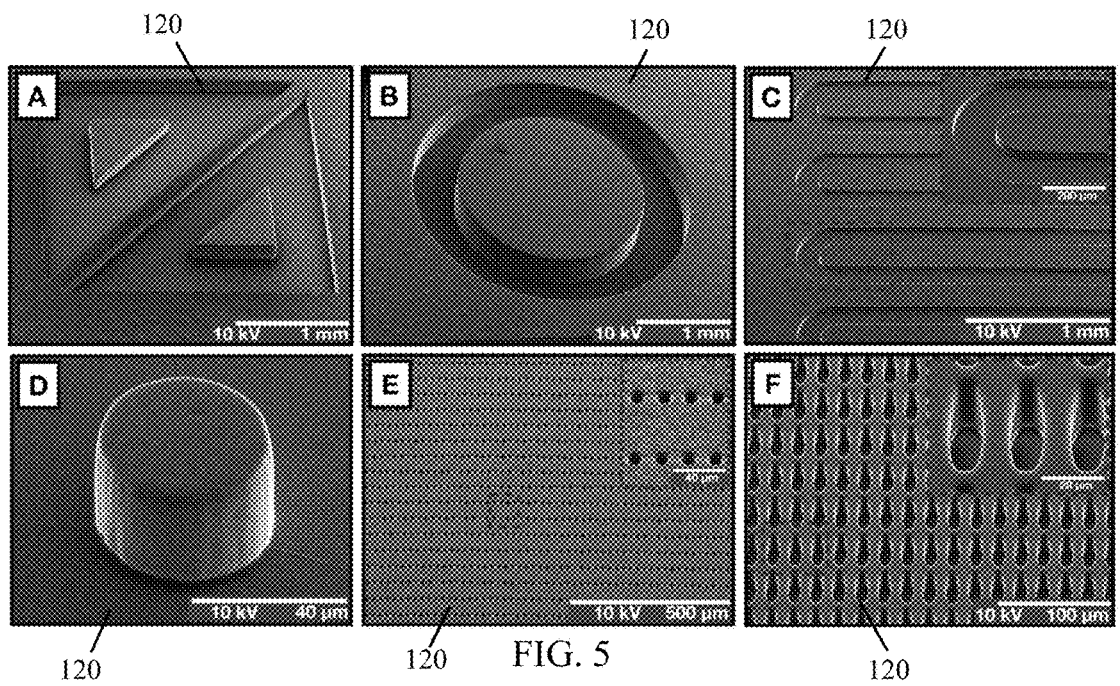
FIG. 5 are images of features of various microsystems.

FIG. 5 show examples of microsystems 120 fabricated from master copy molds 102. This figure shows scanning electron microscopy images with features ranging from a few microns to several millimeters. The examples show microsystems 120 with sharp-edged geometries, vertical sidewalls, and small holes. For example, the images in FIG. 5 show a 2 mm across triangular geometry, a 3 mm circular geometry, 100 μm serpentine microchannels, a 40 μm micropost, a 10 μm diameter circular microwell array, and elliptical microwell arrays with a 10 μm short axis and a 30 μm long axis.

These example microsystems 120 shown in FIG. 5 were fabricated from PC copy molds 102, created from Si—Pr master molds 101 using the replication method described herein. Several of the images shown in FIG. 5 demonstrate that the standard geometries, such as triangles and circles at the millimeter scale, can be successfully copied into PC molds 102 by maintaining the vertical sidewalls and the sharp edges both for the indentations and protrusions. Furthermore, smaller 100 μm wide microchannels with serpentine configurations, which have been used in micromixer applications, can be copied with high fidelity. FIG. 5 further shows various geometries at a smaller scale. Arrays of 40 μm diameter low aspect ratio microposts that are commonly employed for circulating cancer cell isolation and enrichment can also be successfully copied into PC copy molds 102 from Si—Pr composite master molds 101.

Several images in FIG. 5 show the results of a more challenging molding task-copying microscale indentations. Copying these microwell structures with PC melt, which has zero-shear viscosity of approximately 15,000 Pa·sec at 230° C., or three orders of magnitude more viscous than pre-cured Sylgard 184 PDMS, is achievable. 4 hours of baking time at 230° C. permitted duplication of these geometries even in the absence of an externally applied force. Consequently, PC copy molds 102 of circular microwell arrays that are 10 μm in diameter, which are frequently used in single cell analysis as well as the elliptical microwells of similar dimensions for 3D cellular microniches can be successfully fabricated using a copy mold 102.

Another challenging task for any molding process is a microsystem 120 with high aspect ratio microfeatures. These types of microfeatures are frequently used in lab-on-chip applications. Such geometries can deform easily and predictably upon the application of external force enabling the development novel force sensors and microscopic mechanical actuators. This approach has been leveraged to study biomechanical properties of single cells, to build mechanically active organ-on-a-chip microsystems 120, and to apply mechanical stimulation to cells and model organisms. However, the repeatability of the fabrication of the master molds 101 for such high aspect ratio structures remains a challenge in soft lithography, regardless of the master mold fabrication technique due to the inherent problems associated with them as mentioned above. These challenges are exacerbated when continuous high aspect ratio microscale features cover large areas.

Duplication of a master mold 101 with such geometries into a copy mold 102 may be the most feasible solution for improving the limited lifetime of a master mold 101 and to increase the fabrication throughput. However, previous techniques to duplicate the original master mold 101 either used the application of high contact force, a rigid intermediate mold, or the pouring of liquid plastics. Although these techniques are beneficial for some applications, they are not well suited to the fabrication high aspect ratio slender geometries, such as micropost arrays or thin sidewalls, because deflection of the high aspect ratio microfeatures can occur during the pouring and forced degassing processes, which would cause instantaneous local forces on the slender PDMS microstructures. In addition, polyurethane solutions that are used to fabricate copy molds cannot be degassed after pouring on PDMS molds due to their limited pot life, which almost guarantees the creation of air pockets in high aspect ratio indentations.

The method described herein does not require the application of external forces such as in hot embossing, as the PC sheet 110 slowly melts into the PDMS mold 103 and penetrates into the high aspect ratio features due to gravity. Thus, the PCH molding approach with high aspect ratio protrusions can be done without deflecting the high aspect ratio features.

Figure 6A:
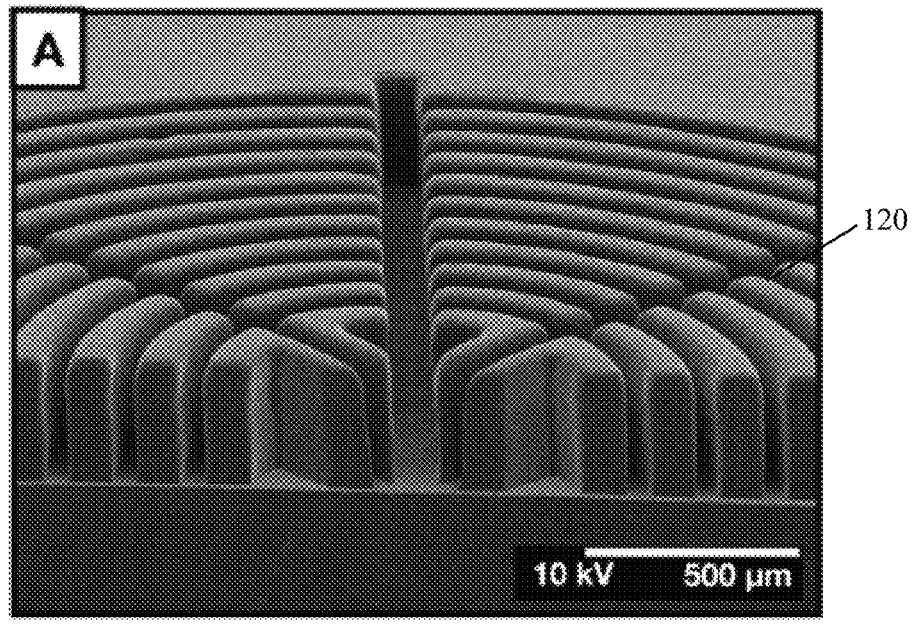
FIGS. 6A-6D are images of high aspect ratio microfeatures.
Figure 6B:
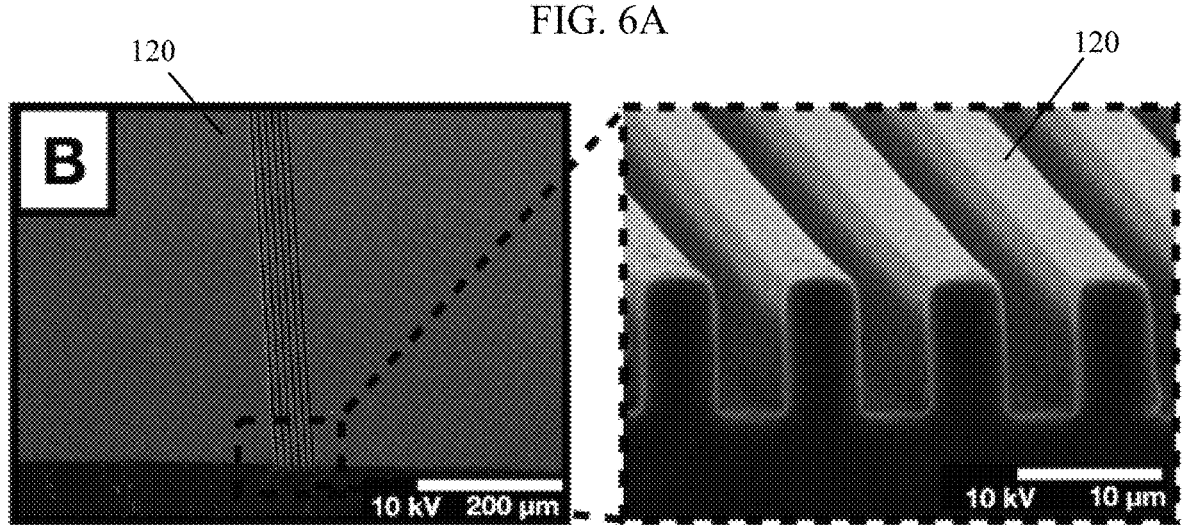
Figure 6C:
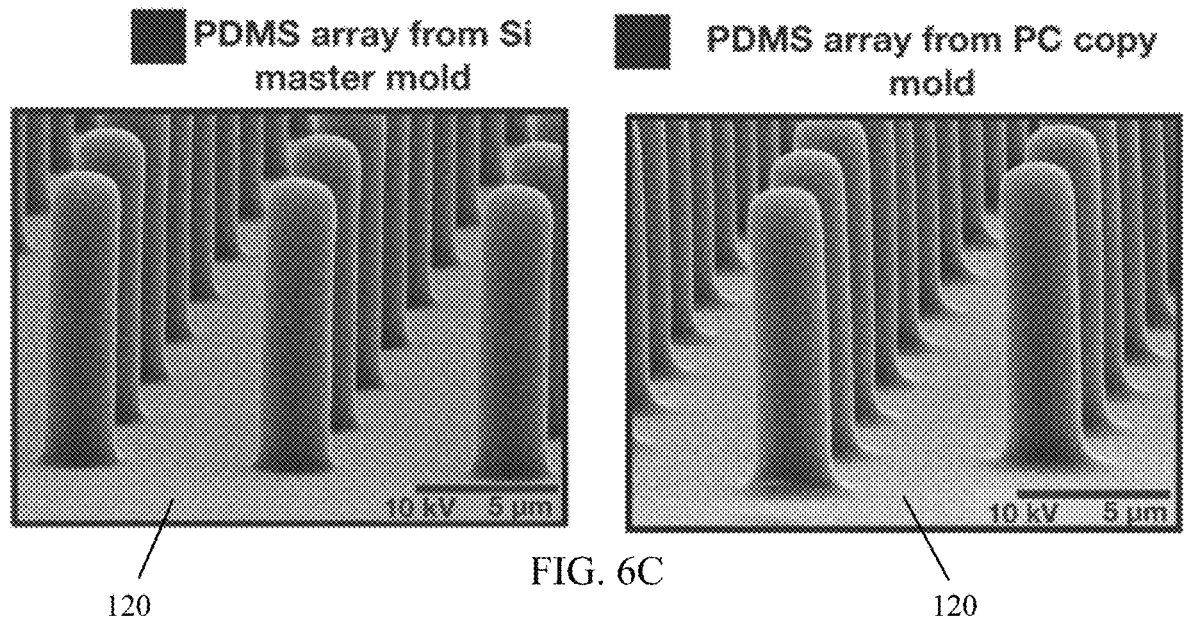
Figure 6D:
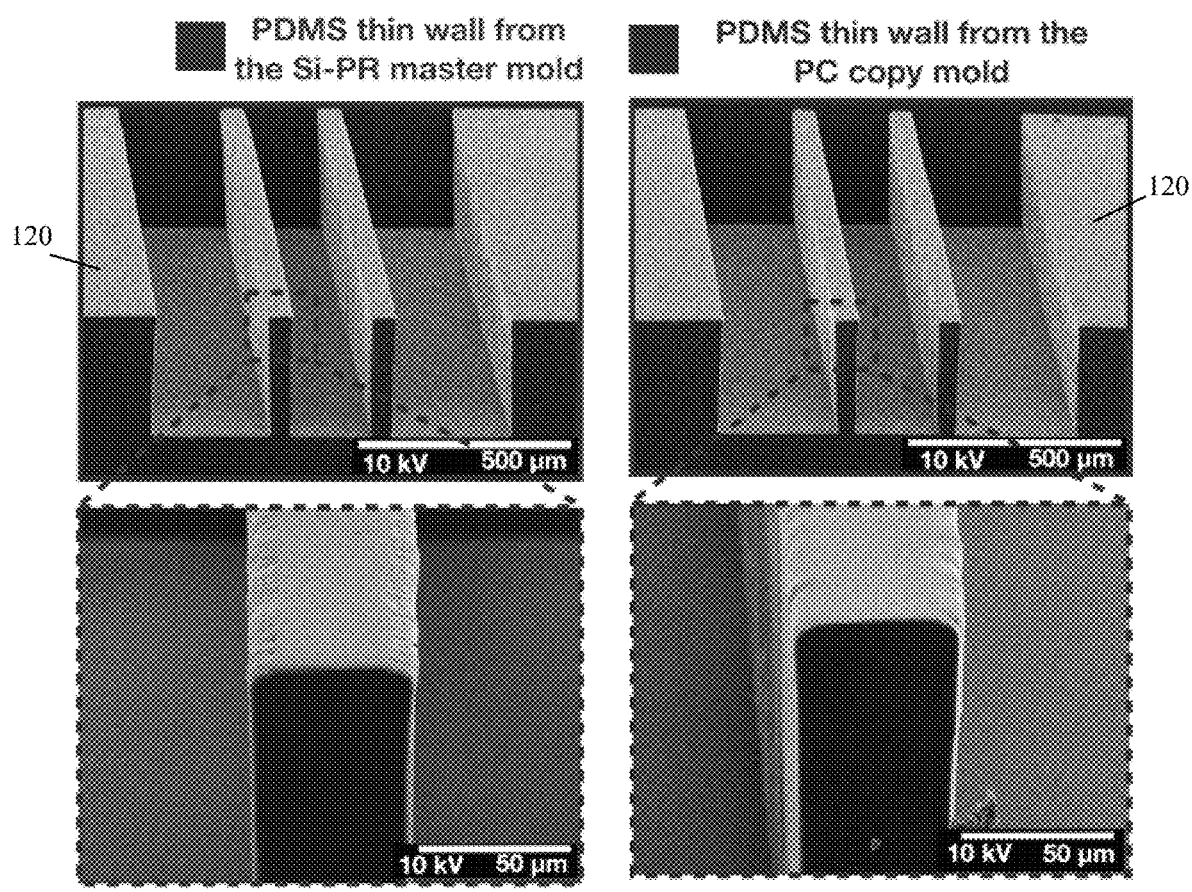

FIGS. 6A-6D show several examples of high aspect ratio features created using a copy mold 102. FIG. 6A shows a concentric high aspect ratio (AR) microchannel array with a 300 μm height and a 50 μm width (AR=6). Fabrication of these PDMS geometries required successful filling of the high aspect ratio circular microgrooves with melted PC during the mold copying process. FIG. 6B shows a parallel microchannel array with a 5 μm width and a 10 μm height (AR=2). FIG. 6C shows a quantitative comparison of 10 μm high by 2.5 μm diameter high-aspect-ratio (AR=4) PDMS micropost arrays fabricated through a silicon master mold 101 (left) and polycarbonate copy mold 102 (right), respectively. The PDMS micropost arrays fabricated through the PC copy mold 102 have a 5.40% increase in height and 4.95% increase in diameter without changing the variation of the micropost dimensions. The microposts of the PC copy mold 102 do not deform when compared to the microposts fabricated from the master mold 101. FIG. 6D is a visual comparison of microsystems 120 having high aspect ratio PDMS sidewalls with 350 μm height and 50 μm width (AR=7) fabricated through a silicon master mold 101 (left) and a PC copy mold 102 (right). Insets show the critical top surface of the walls in more detail, where the flat top surface was preserved in the PDMS parts 120 fabricated through the PC copy molds 102. High aspect ratio PDMS sidewalls fabricated through the PC copy mold 102 demonstrated a 3.10% increase in wall thickness and 3.77% increase in the width of the central microchannel without affecting the variation of the feature dimensions.

The quantitative comparison of the dimensions of the micropillars reveals that micropillars fabricated through the PC copy mold 102 were larger, with their height and diameter increased by 5.4% and 4.95%, respectively. Although, the distribution of the height and diameter measurements throughout the pattern did not substantially change, implying that the PC heat molding process does not introduce any further dimensional fluctuation but rather shifts the dimensions of the micropillars isotropically.

Figure 7:
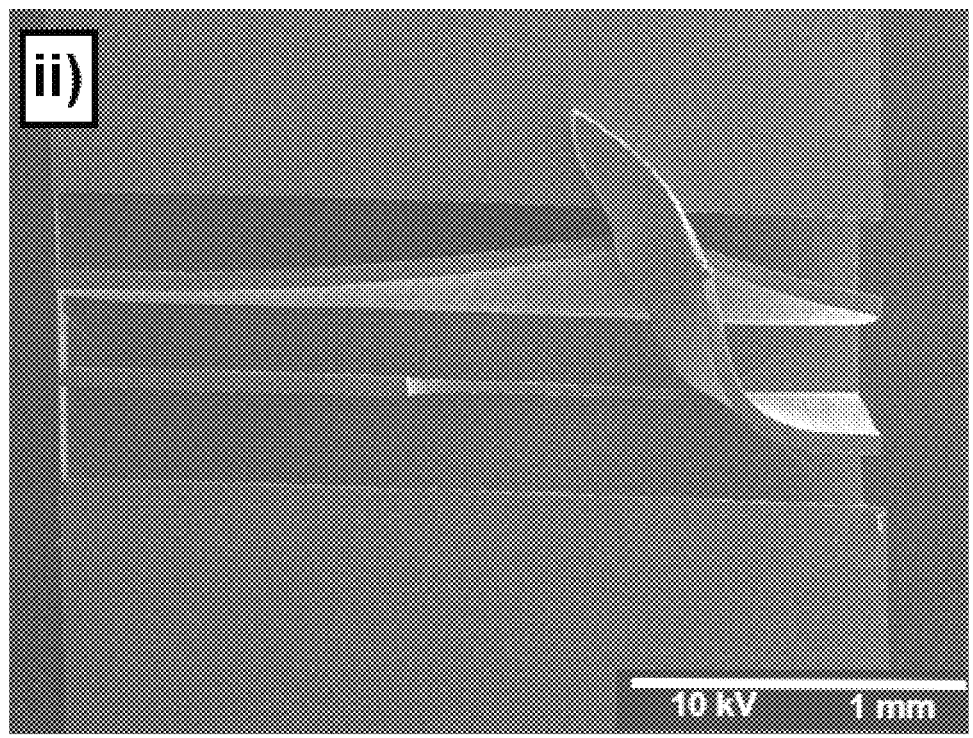
FIG. 7 is an image of a deformed microfeature using a prior art technique.

Referring again to FIG. 6D, the high aspect ratio straight sidewalls were not deformed during the heat molding process. Prior art master mold copying techniques often deform the sidewalls or the copy mold material sticks to the master mold 101 and leads to partial or total rupture of the sidewalls, as shown in FIG. 7. A quantitative comparison of the PDMS sidewalls fabricated through a PC copy mold 102 and the PDMS sidewalls fabricated from a Si—Pr master mold 101 reveal a similar dimensional shift in the feature dimensions. The high aspect ratio PDMS sidewalls fabricated through the PC copy mold 102 had a 3.10% increase in sidewall thickness and a 3.77% increase in the central microchannel width without introducing further variation to the feature dimensions.

High aspect ratio geometries can be used as deformable elements in a microsystem 120. The deformable elements are actuated by hydraulic or pneumatic pressure and typically have flat surfaces which are bonded to flat substrates like glass to seal the microsystem 120. Rounded top surfaces reduce the effective bonding area and would lead to leakage upon the application of the actuation force. PDMS microsystems 120 fabricated using a PC copy mold 102 were tested against increasing pneumatic pressures to evaluate the functionality of the microfluidic channels. As pneumatic pressure was applied to the microchannels at either side of the central channel, the PDMS sidewalls deformed inwards and they did not leak or detach up to pressures as high as 40 PSI. High magnification SEM images show the flatness of the tip of the PDMS sidewalls compared to the sidewall of a microsystem 120 fabricated using a Si—Pr master mold 101 (see FIG. 6D, insets). The images confirm the findings from these experimental pressure tests. A microsystem fabricated using a conventional master mold copying technique failed in the pneumatic pressure testing due to the detachment of the PDMS walls from the glass slides at a pneumatic pressure as low as 1 PSI, due to rounded tops of the sidewalls.

Continued development in the microdevice field has led to increasingly complex systems with multiple layers of PDMS building blocks. This often requires the combination of PDMS layers with different feature geometries obtained from different master molds that have been fabricated using different microfabrication techniques. However, PDMS has different curing characteristics on different molds which can be problematic, especially if the final system needs to be structurally active (i.e. mechanical properties of the PDMS features need to be utilized) or if residual uncrosslinked polymer chains remaining in the PDMS needs to be controlled. In addition, some master mold materials are not thermally stable. For example, heating/cooling cycles lead to delamination of the thick photoresist layers in Si—Pr composite master molds. Some UV curable resins used in 3D printing have low heat deflection temperature, which requires curing of the PDMS at low temperatures for prolonged times, limiting the throughput of fabrication. Furthermore, master molds containing residual sulfur, unsaturated hydrocarbon plasticizers, or organotin catalyst can prevent PDMS from curing thoroughly rendering them unusable.

Figure 8A:
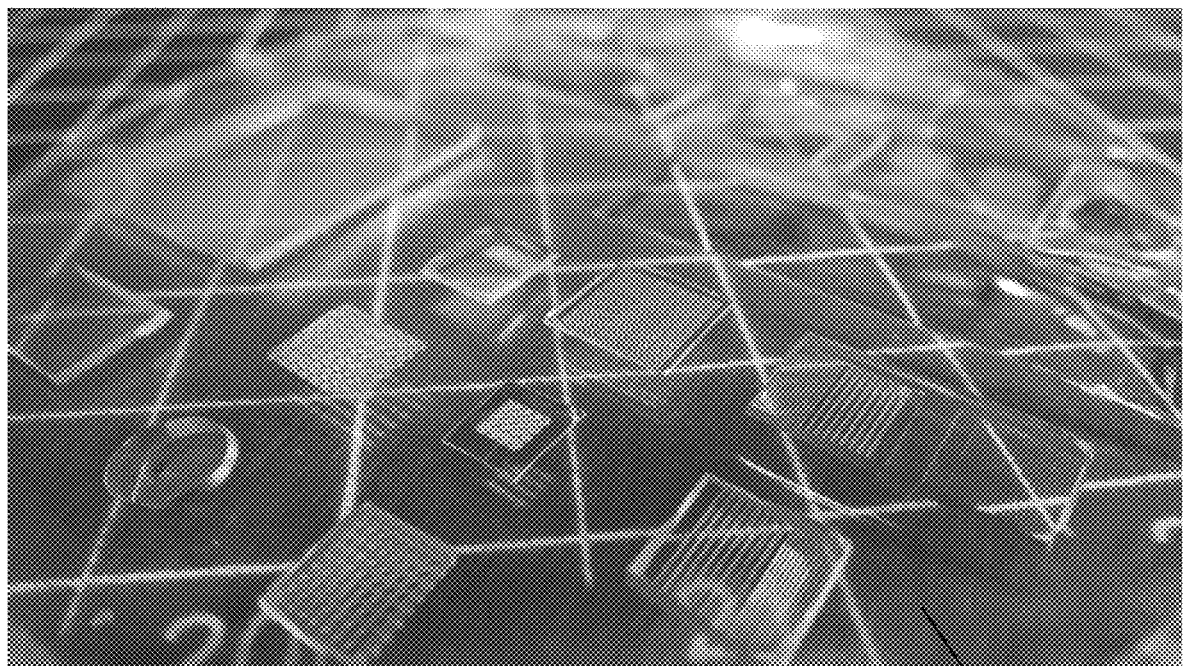
FIGS. 8A-8B are multi-component copy molds.

The present method can be utilized to create molds having large surface areas. Taking advantage of this property, several separate molds can be simultaneously copied. In the example shown in FIG. 8A, 19 unique PDMS microsystems 120 obtained from master molds 101 fabricated by either photolithography, mechanical micromilling, or 3D printing were copied into a single monolithic PC copy mold 102. Simultaneous molding is done to prevent the problems associated with complex microfluidic devices. Using this approach, the separate PDMS microsystems or parts 120 can be fabricated through a single monolithic PC mold 102 consistently. The copy mold 102 shown in FIG. 8A is a 4-inch diameter copy mold 102 with various geometries, including high aspect ratio microposts (master mold 101 created through photolithography), undulated microtopology (master mold 101 created through stereolithography 3D printing), multistep microfluidic flow circuit (master mold 101 created through stereolithography 3D printing), semicircular micro-rib array (master mold 101 created through mechanical micromilling), triangular microfluidic concentrator array (master mold 101 created through photolithography).

Figure 8B:
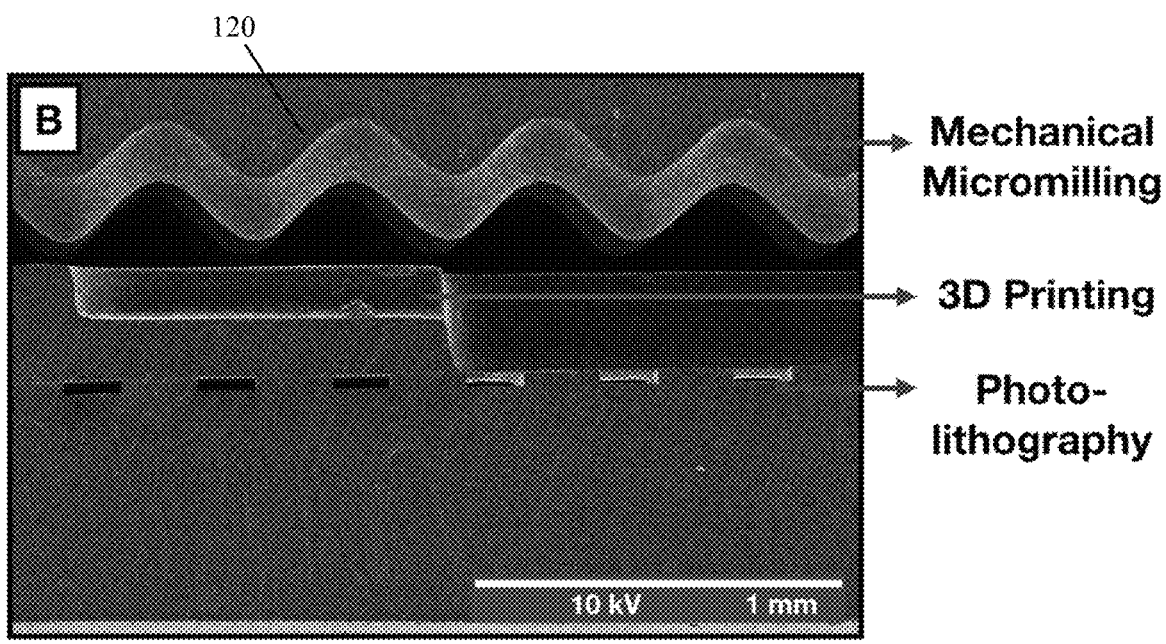

Given the unique advantages of each master mold fabrication technique such as multi-step complex geometry fabrication with 3D printing (FIG. 8A), fabrication of the features with continuously changing height distribution with mechanical micromilling, and high resolution high aspect ratio fabrication using photolithography, it would be challenging to fabricate these PDMS microfeatures from a single master mold with a single step. As shown in FIG. 8B, the PC molding technique is used to produce PDMS parts 120 from a PC copy mold 102 and fabricated a multilayer microfluidic device 120 where each layer of the microfluidic device 120 was originally fabricated through a different master mold fabrication technique. This shows individual layers that would be very hard to fabricate using a single master mold microfabrication technique. This type of PCH molding approach could be very useful to produce kits with monolithically unified geometries that could be used to directly fabricate building blocks for complex multilayered microfluidic systems 120.

When used in this specification and claims, the terms "comprises" and "comprising" and variations thereof mean that the specified features, steps or integers are included. The terms are not to be interpreted to exclude the presence of other features, steps or components.

The invention may also broadly consist in the parts, elements, steps, examples and/or features referred to or indicated in the specification individually or collectively in any and all combinations of two or more said parts, elements, steps, examples and/or features. In particular, one or more features in any of the embodiments described herein may be combined with one or more features from any other embodiment(s) described herein.

Protection may be sought for any features disclosed in any one or more published documents referenced herein in combination with the present disclosure. Although certain example embodiments of the invention have been described, the scope of the appended claims is not intended to be limited solely to these embodiments. The claims are to be construed literally, purposively, and/or to encompass equivalents.

What is claimed is:

1. A method of replicating a master mold of a microsystem having a plurality of features, the method comprising:
    forming a replica mold from the master mold, wherein the replica mold comprises an elastomer and has negative features of the master mold;
    placing a solid sheet of a polymer on the surface of the replica mold;
    heating the sheet and the replica mold to a temperature above the glass transition temperature of the polymer;
    maintaining the temperature for a period of time sufficient to allow the polymer to disperse into the negative features of the replica mold absent an application of an external force to the polymer;
    cooling the polymer below the glass transition temperature, forming a solid polymer; and
    removing the replica mold from the polymer, wherein the solidified polymer forms a copy mold and has the shape of the master mold.

2. The method of claim 1, wherein the polymer is polycarbonate.

3. The method of claim 1, wherein the elastomer is polydimethylsiloxane.

4. The method of claim 1, wherein the polymer is a thermoplastic.

5. The method of claim 1, further comprising:
    molding the microsystem using the copy mold.

6. The method of claim 1, further comprising:
    drying the polymer sheet prior to heating.

7. The method of claim 6, wherein drying the polymer sheet occurs at a temperature less than the glass transition temperature of the polymer.

8. The method of claim 1, wherein the temperature is less than a thermal degradation temperature of the replica mold.

9. The method of claim 1, wherein the copy mold has a thickness equal to a thickness of the replica mold.

10. The method of claim 1, wherein the replica mold is surrounded by a rectangular-section o-ring prior to heating the sheet.

11. The method of claim 1, wherein the polymer sheet is constrained by a physical barrier during the melting step.

12. The method of claim 1, wherein the polymer sheet has a thickness greater than a thickness of the replica mold.

13. The method of claim 1, wherein the features comprise at least one of a vertical sidewall, a small hole, a micropost, a circular microwell, and an elliptical microwell.

14. The method of claim 1, wherein the features have a high aspect ratio.

15. The method of claim 1, wherein the polymer disperses into the negative features of the replica mold in the absence of an external force placed on the polymer sheet or the replica mold.

16. The method of claim 1, wherein the polymer has a lower surface energy than the elastomer.

* * * * *